(12) United States Patent
Park et al.

(10) Patent No.: US 11,755,140 B2
(45) Date of Patent: Sep. 12, 2023

(54) TOUCH SENSOR AND DISPLAY DEVICE INCLUDING THE SAME

(71) Applicant: SAMSUNG DISPLAY CO., LTD., Yongin-si (KR)

(72) Inventors: Sang Hun Park, Yongin-si (KR); Yong Sub So, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/523,294

(22) Filed: Nov. 10, 2021

(65) Prior Publication Data
US 2022/0214792 A1 Jul. 7, 2022

(30) Foreign Application Priority Data

Jan. 6, 2021 (KR) .................. 10-2021-0001643

(51) Int. Cl.
*G06F 3/041* (2006.01)
*H01L 25/075* (2006.01)
*G06F 3/044* (2006.01)

(52) U.S. Cl.
CPC ........ *G06F 3/04164* (2019.05); *G06F 3/0412* (2013.01); *H01L 25/0753* (2013.01); *G06F 3/044* (2013.01)

(58) Field of Classification Search
CPC .... G06F 3/04164; G06F 3/0412; G06F 3/044; H01L 25/0753
See application file for complete search history.

(56) References Cited

U.S. PATENT DOCUMENTS

| 9,524,054 | B2 | 12/2016 | Kim et al. | |
|---|---|---|---|---|
| 10,275,089 | B2 | 4/2019 | Kim et al. | |
| 2019/0213374 | A1* | 7/2019 | Kwon | ................ G06V 40/1306 |
| 2020/0159352 | A1* | 5/2020 | Shimada | ................ G06F 3/0416 |
| 2021/0064170 | A1* | 3/2021 | Hwang | ................... G06F 3/038 |
| 2021/0286473 | A1 | 9/2021 | Park et al. | |

FOREIGN PATENT DOCUMENTS

| KR | 1020160061502 A | 6/2016 |
|---|---|---|
| KR | 1020170039053 A | 4/2017 |
| KR | 1020200103123 A | 9/2020 |
| KR | 1020210114605 A | 9/2021 |
| WO | 2015050700 A1 | 4/2015 |

* cited by examiner

*Primary Examiner* — Peter D McLoone
(74) *Attorney, Agent, or Firm* — CANTOR COLBURN LLP (57) ABSTRACT

A touch sensor includes a sensor cell coupled to a sensor line, a sensor transmitter including a first switch coupled to the sensor line and a power supply which supplies a charging signal to the sensor line during a first period during which the first switch is turned on, and a sensor receiver including a second switch coupled to the sensor line and a sensor channel which receives a sensing signal from the sensor line during a second period during which the second switch is turned on. The sensor receiver further includes a coupling capacitor including a first electrode coupled to the second switch and a second electrode coupled to the sensor channel.

18 Claims, 11 Drawing Sheets

<Initializing>

TOUCH SENSOR AND DISPLAY DEVICE INCLUDING THE SAME

The application claims priority to Korean Patent Application No. 10-2021-0001643 filed on Jan. 6, 2021, and all the benefits accruing therefrom under 35 U.S.C. § 119, the content of which in its entirety is herein incorporated by reference.

BACKGROUND

1. Field

Various embodiments of the invention relate to a touch sensor and a display device including the same.

2. Description of the Related Art

With a development of information technology, an importance of a display device, which is a connecting medium between information and users, is being emphasized. Accordingly, a use of display devices, such as liquid crystal display devices, organic light-emitting display devices, and the like, is increasing.

A display device is able to receive a touch input by a user, active pen input, or the like by including capacitance sensors in a display area thereof. The capacitance sensors may be classified into sensors based on a sensing method using mutual capacitance between two or more sensors and sensors based on a sensing method using self-capacitance of each of the sensors.

SUMMARY

In a sensing method using a self-capacitance, a high-voltage charging signal cannot be used due to a withstanding voltage issue of a touch integrated chip ("IC"), and thus it is difficult to generate a sensing signal having a high signal-to-noise ratio ("SNR").

Various embodiments of the invention are directed to a touch sensor, capable of generating a sensing signal having a high SNR by enabling a high-voltage charging signal to be used in a sensing method using a self-capacitance, and a display device including the touch sensor.

An embodiment of the invention provides a touch sensor. The touch sensor includes a sensor cell coupled to a sensor line, a sensor transmitter including a first switch coupled to the sensor line and a power supply which supplies a charging signal to the sensor line during a first period during which the first switch is turned on, and a sensor receiver including a second switch coupled to the sensor line and a sensor channel which receives a sensing signal from the sensor line during a second period during which the second switch is turned on. The sensor receiver further includes a coupling capacitor including a first electrode coupled to the second switch and a second electrode coupled to the sensor channel.

In an embodiment, the sensor channel may be an integrator.

In an embodiment, the sensor channel may include an amplifier including a first input terminal coupled to the second electrode of the coupling capacitor, a second input terminal which receives a reference voltage, and an output terminal, a sensing capacitor which couples the first input terminal to the output terminal, and a reset switch which selectively couples the first input terminal to the output terminal.

In an embodiment, the sensor receiver may further include an analog-to-digital converter which receives a signal output from the sensor channel, and a processor which receives a signal output from the analog-to-digital converter.

In an embodiment, the second switch may be in a turn-off state during the first period, and the first switch may be in the turn-off state during the second period.

In an embodiment, the first switch may be in a turn-on state during a third period after the second period, and the power supply may supply an initialization signal to the sensor line during the third period.

In an embodiment, the voltage level of the reference voltage may be a value between the voltage level of the charging signal and the voltage level of the initialization signal.

In an embodiment, the touch sensor may further include a sensor offset component coupled to the sensor receiver and including offset capacitors and offset switches respective coupled to the offset capacitors.

In an embodiment, during the first period and the second period, some of the offset switches may remain turned on and the remaining ones of the offset switches may remain turned off.

In an embodiment, during the second period, an offset voltage applied in common to the first electrodes of the offset capacitors may decrease.

An embodiment of the invention provides a display device. The display device includes pixels respective including light emitting diodes, a sensor cell which is coupled to a sensor line and forms a self-capacitance with the cathode of the light emitting diodes, a sensor transmitter including a first switch coupled to the sensor line and a power supply which supplies a charging signal to the sensor line during a first period during which the first switch is turned on, and a sensor receiver including a second switch coupled to the sensor line and a sensor channel which receives a sensing signal from the sensor line during a second period during which the second switch is turned on. The sensor receiver further includes a coupling capacitor including a first electrode coupled to the second switch and a second electrode coupled to the sensor channel.

An embodiment of the invention provides a touch sensor. The touch sensor includes a sensor cell coupled to a sensor line, a sensor transmitter including a first switch coupled to the sensor line and a power supply which supplies a charging signal to the sensor line during a first period during which the first switch is turned on, and a sensor receiver including a second switch coupled to the sensor line and a sensor channel which receives a sensing signal from the sensor line during a second period during which the second switch is turned on. The sensor receiver further includes a voltage divider coupled between the second switch and the sensor channel.

In an embodiment, the voltage divider may include resistors coupled in series to each other.

In an embodiment, the sensor channel may include an amplifier including a first input terminal coupled to a point between the resistors, a second input terminal which receives a reference voltage, and an output terminal, a sensing capacitor which couples the first input terminal to the output terminal, and a reset switch which selectively couples the first input terminal to the output terminal.

In an embodiment, the second switch may be in a turn-off state during the first period, and the first switch may be in the turn-off state during the second period.

In an embodiment, the first switch may be in a turn-on state during a third period after the second period, and the power supply may supply an initialization signal to the sensor line during the third period.

In an embodiment, the voltage level of the reference voltage may be a value between the voltage level of the charging signal and the voltage level of the initialization signal.

In an embodiment, the touch sensor may further include a sensor offset component coupled to the sensor receiver and including offset capacitors and offset switches respective coupled to the offset capacitors.

In an embodiment, during the first period and the second period, some of the offset switches may remain turned on and the remaining ones of the offset switches may remain turned off.

In an embodiment, during the second period, an offset voltage applied in common to the first electrodes of the offset capacitors may decrease.

BRIEF DESCRIPTION OF THE DRAWINGS

The above and other embodiments, advantages and features of this disclosure will become more apparent by describing in further detail embodiments thereof with reference to the accompanying drawings.

DETAILED DESCRIPTION

Hereinafter, embodiments of the invention will be described in detail with reference to the attached drawings, such that those skilled in the art may easily implement the invention. Embodiments of the invention may be embodied in various different forms without being limited to the following embodiments.

Furthermore, in the drawings, portions which are not related to the invention will be omitted to explain the invention more clearly. Reference should be made to the drawings, in which similar reference numerals are used throughout the different drawings to designate similar components. Therefore, reference numerals described in a previous drawing may be used in other drawings.

Further, since the sizes and thicknesses of respective components are arbitrarily indicated in drawings for convenience of description, the invention is not limited by the drawings. The sizes, thicknesses, etc. of components in the drawings may be exaggerated to make the description of a plurality of layers and areas clear.

Also, when elements are described as being "the same", the elements may be interpreted as being "substantially the same". Here, the degree of sameness may be satisfactory to those having ordinary knowledge. Other expressions may also be expressions from which the term "substantially" is omitted.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Figure 1:
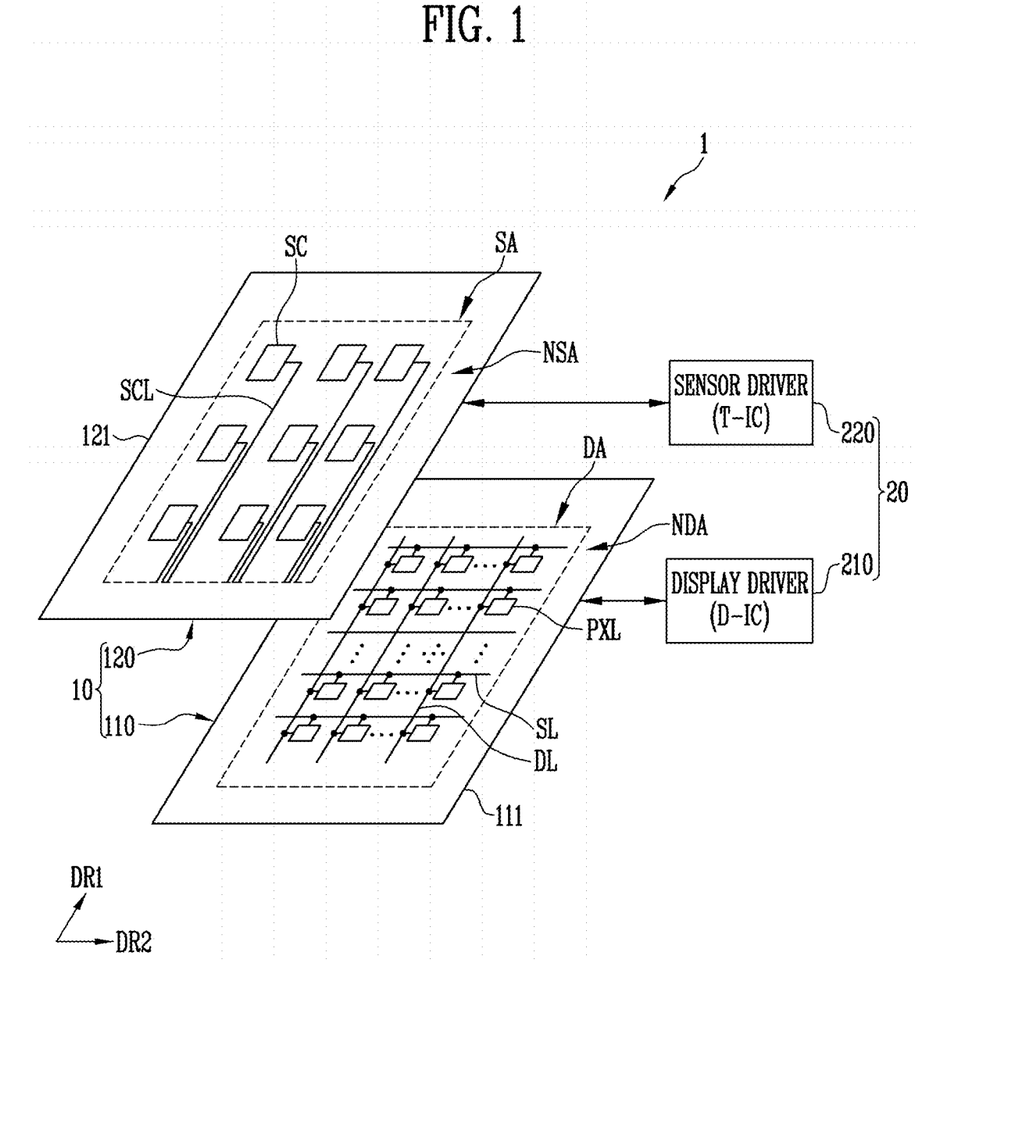
FIG. 1 is a diagram illustrating an embodiment of a display device according to the invention.

FIG. 1 is a diagram illustrating an embodiment of a display device according to the invention.

Referring to FIG. 1, the display device 1 in an embodiment of the invention may include a panel 10 and a driver circuit 20 for driving the panel 10.

In an embodiment, the panel 10 may include a display 110 for displaying an image and a sensor 120 for sensing a touch, a pressure, a fingerprint, hovering, an active pen, or the like, for example. The sensor 120 may overlap the display 110. In an embodiment, the panel 10 may include pixels PXL and sensor cells SC overlapping at least some of the pixels PXL. The driver circuit 20 may include a display driver 210 for driving the display 110 and a sensor driver 220 for driving the sensor 120. A set of the sensor 120 and the sensor driver 220 may be referred to as a touch sensor. In an embodiment, the touch sensor may be manufactured to be separated from the display 110 and the display driver 210.

In an embodiment, after being separately manufactured, the display 110 and the sensor 120 may be disposed and/or combined such that at least portions thereof overlap each other. In an alternative embodiment, the display 110 and the sensor 120 may be manufactured as a single body. In an embodiment, a sensor substrate 121 of the sensor 120 may correspond to an upper substrate of the display 110, for example. In an embodiment, the sensor substrate 121 may be an encapsulation film which covers the pixels PXL, for example.

Although the sensor 120 is illustrated as being disposed on the front surface of the display 110 (e.g., on the upper surface on which an image is displayed) in FIG. 1, the location of the sensor 120 is not limited thereto. In an embodiment, the sensor 120 may be disposed on the back surface of the display 110 or on the front and back surfaces thereof, for example. In an embodiment, the sensor 120 may be disposed at an edge area of at least one side of the display 110.

The display 110 may include a display substrate 111 and a plurality of pixels PXL disposed on the display substrate 111. The pixels PXL may be disposed in the display area DA of the display substrate 111.

The display substrate 111 may include the display area DA in which an image is displayed and a non-display area NDA around the display area DA. In an embodiment, the display area DA may be disposed in the central area of the display 110, and the non-display area NDA may be disposed in the edge area of the display 110 so as to enclose the display area DA.

The display substrate 111 may be a rigid substrate or a flexible substrate, and the material or property thereof is not specifically limited. In an embodiment, the display substrate 111 may be a rigid substrate including glass or reinforced glass, or may be a flexible substrate including a thin film including plastic or metal, for example.

Scan lines SL, data lines DL, and the pixels PXL coupled to the scan lines SL and the data lines DL are disposed in the display area DA. The pixels PXL are selected in response to a scan signal having a turn-on level, which is supplied from the scan lines SL, and are supplied with a data voltage from the data lines DL, thereby emitting light with luminance corresponding to the data voltage. Accordingly, an image corresponding to the data voltage is displayed in the display area DA. In the invention, the structure of the pixels PXL and a method of operating the same are not specifically limited. In an embodiment, each of the pixels PXL may be implemented as a pixel based on any of currently known various structures and/or driving methods, for example.

Various lines coupled to the pixels PXL in the display area DA and/or an embedded circuit may be disposed in the non-display area NDA. In an embodiment, a plurality of lines for supplying various types of power and control signals to the display area DA may be disposed in the non-display area NDA, and a scan driver and the like may be further disposed therein, for example.

In the invention, the type of the display 110 is not specifically limited. In an embodiment, the display 110 may be implemented as a self-emissive display panel, such as an organic/inorganic light emitting diode display panel, or the like, or the display 110 may be implemented as a non-emissive display panel, such as a liquid crystal display panel, or the like. When the display 110 is implemented as a non-emissive type, the display device 1 may additionally include a light source such as a backlight unit.

The sensor 120 includes the sensor substrate 121 and a plurality of sensor cells SC disposed on the sensor substrate 121. The sensor cells SC may be disposed in the sensing area SA of the sensor substrate 121. The sensor cells SC may be coupled to sensor lines SCL. When the touch sensor is configured based on a self-capacitance method, the sensor cells SC and the sensor lines SCL may be coupled to each other in a one-to-one manner.

The sensor substrate 121 may include the sensing area SA in which touch input or the like may be sensed and a peripheral area NSA around the sensing area SA. In an embodiment, the sensing area SA may overlap at least a portion of the display area DA. In an embodiment, the sensing area SA may be set to an area corresponding to the display area DA (e.g., an area overlapping the display area DA), and the peripheral area NSA may be set to an area corresponding to the non-display area NDA (e.g., an area overlapping the non-display area NDA), for example. Accordingly, when touch input or the like is provided on the display area DA, the touch input may be detected through the sensor 120.

The sensor substrate 121 may be a rigid or flexible substrate, and may include at least one insulating layer other than that. Also, the sensor substrate 121 may be a transparent or translucent light-transmissive substrate, but is not limited thereto. That is, the material and property of the sensor substrate 121 are not specifically limited in the invention. In an embodiment, the sensor substrate 121 may be a rigid substrate including glass or reinforced glass, or may be a flexible substrate including a thin film including plastic or metal, for example. Also, in an embodiment, at least one substrate forming the display 110 (e.g., the display substrate 111, an encapsulation substrate and/or a thin-film encapsulation layer) or at least one insulating layer or function layer disposed in the display 110 and/or disposed on the outer surface of the display 110 may be used as the sensor substrate 121.

The sensing area SA is set as an area capable of responding to a user input (that is, the active area of the sensor). To this end, the sensor cells SC for sensing the user input or the like may be disposed in the sensing area SA. In an embodiment, the sensor cells SC may be arranged in a matrix form based on a first direction DR1 and a second direction DR2 perpendicular to the first direction DR1, for example. In an embodiment, the first direction DR1 and the second direction DR2 may not be perpendicular to each other. In an embodiment, the sensor cells SC may be arranged in a circular or elliptical shape or diagonally, and may not be necessarily arranged in a matrix form. Each of the sensor cells SC may have any of various shapes, such as a quadrangular (e.g., rectangular), triangular, circular, or mesh shape.

In an embodiment, each of the sensor cells SC may have conductivity by including at least one of a metallic material, a transparent conductive material, and any other various conductive materials. In an embodiment, the sensor cells SC may include at least one of various kinds of metallic materials, including gold (Au), silver (Ag), aluminum (Al), molybdenum (Mo), chromium (Cr), titanium (Ti), nickel (Ni), neodymium (Nd), copper (Cu), platinum (Pt), and the like, or an alloy thereof, for example. Here, the sensor cells SC may be provided in a mesh shape. Also, In an embodiment, the sensor cells SC may include at least one of various transparent conductive materials including silver nanowire (AgNW), indium tin oxide ("ITO"), indium zinc oxide ("IZO"), indium gallium zinc oxide ("IGZO"), antimony zinc oxide ("AZO"), indium tin zinc oxide ("ITZO"), zinc oxide (ZnO), tin oxide ($SnO_2$), carbon nano tube, graphene, and the like. In addition thereto, the sensor cells SC include at least one of various conductive materials, and may thus have conductivity. Also, each of the sensor cells SC may include a single layer or a multi-layer, and the cross-sectional structure thereof is not specifically limited.

The sensor lines SCL may be disposed in the same layer as the sensor cells SC. In an embodiment, the sensor lines SCL may be disposed on a different layer by being separated from the sensor cells SC by an insulating layer. Here, the sensor lines SCL may be coupled to the corresponding ones of the sensor cells SC through contact holes of the insulating layer. The sensor lines SCL may include various conductive materials, and may include a material that is the same as or different from the material of the sensor cells SC.

The driver circuit 20 may include the display driver 210 for driving the display 110 and the sensor driver 220 for driving the sensor 120. In an embodiment, the display driver 210 and the sensor driver 220 may be configured as integrated chips ("ICs") that are separate from each other. In an embodiment, at least portions of the display driver 210 and the sensor driver 220 may be integrated into a single IC.

The display driver 210 drives the pixels PXL by being electrically coupled to the display 110. In an embodiment, the display driver 210 may include a data driver 12 and a timing controller 11, and a scan driver 13 may be separately disposed (e.g., mounted) in the non-display area NDA of the display 110 (refer to FIG. 2), for example. In an embodiment, the display driver 210 may include all or at least some of the data driver 12, the timing controller 11, and the scan driver 13.

The sensor driver 220 drives the sensor 120 by being electrically coupled to the sensor 120. In an embodiment, the sensor driver 220 may be coupled to the sensor cells SC through the sensor lines SCL, for example. The sensor driver 220 may include a sensor transmitter and a sensor receiver.

Figure 2:
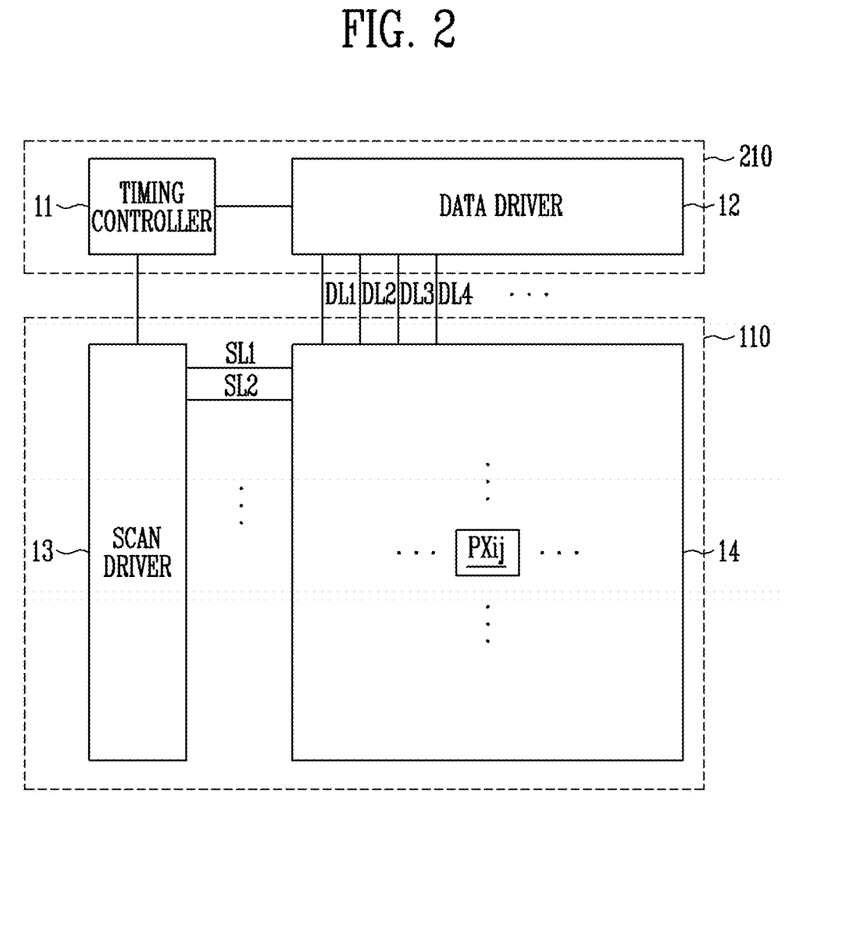
FIG. 2 is a diagram illustrating an embodiment of a display and a display driver according to the invention.

FIG. 2 is a diagram illustrating an embodiment of a display and a display driver according to the invention.

Referring to FIG. 2, the display driver 210 may include a data driver 12 and a timing controller 11, and the display 110 may include a scan driver 13. However, as described above, whether the respective functional components are integrated into a single IC, are integrated into a plurality of ICs, or are disposed (e.g., mounted) on the display substrate 111 may be determined depending on the specification of the display device 1.

The timing controller 11 may receive grayscales for each frame and control signals from a processor. In an embodiment, the processor may be a graphics processing unit ("GPU"), a central processing unit ("CPU"), an application processor ("AP"), or the like, for example. The control signals may include a vertical synchronization signal, a horizontal synchronization signal, a data enable signal, and the like.

Each cycle of the vertical synchronization signal may correspond to each display frame period. In an embodiment, the vertical synchronization signal may indicate an active period of the corresponding display frame period when it is at a logic high level, and may indicate a blank period of the corresponding display frame period when it is at a logic low level, for example. The respective cycles of the horizontal synchronization signal may correspond to respective horizontal periods. The data enable signal may be at an enable level (e.g., a logic high level) while grayscales are supplied from the processor, and may be at a disable level (e.g., a logic low level) while grayscales are not supplied.

The timing controller 11 may render the grayscales so as to correspond to the specification of the display device 1. In an embodiment, the processor may provide a red grayscale, a green grayscale, and a blue grayscale for each unit dot, for example. In an embodiment, when a pixel component 14 is in an RGB stripe structure, a pixel may correspond to each grayscale in a one-to-one manner, for example. In this case, it may not be desired to render the grayscales. However, when the pixel component 14 is, for example, in a pentile structure, because unit dots adjacent to each other share a pixel therebetween, a pixel may not correspond to each grayscale in a one-to-one manner. In this case, it may be desired to render the grayscales. The grayscales that are rendered or that are not rendered may be provided to the data driver 12. Also, the timing controller 11 may provide a data control signal to the data driver 12. Also, the timing controller 11 may provide a scan control signal to the scan driver 13.

The data driver 12 may generate data voltages to provide to data lines DL1, DL2, DL3 and DL4 using the grayscales and the data control signal received from the timing controller 11.

The scan driver 13 may generate scan signals to provide to scan lines SL1 and SL2 using a clock signal, a scan start signal, and the like received from the timing controller 11. The scan driver 13 may sequentially supply scan signals having a pulse of a turn-on level to the scan lines SL1 and SL2. In an embodiment, the scan driver 13 may supply scan signals of a turn-on level to the scan lines according to a cycle corresponding to the cycle of the horizontal synchronization signal, for example. The scan driver 13 may include scan stages configured in the form of a shift register. The scan driver 13 may generate scan signals in such a way that a scan start signal in the form of a pulse of a turn-on level is sequentially delivered to the next scan stage under the control of a clock signal.

The pixel component 14 includes pixels. Each of the pixels may be coupled to the data line and the scan line corresponding thereto. In an embodiment, a pixel PXij may be coupled to the i-th scan line and the j-th data line where i and j are natural numbers, for example. The pixels may include pixels which emit a first color of light, pixels which emit a second color of light, and pixels which emit a third color of light. The first color, the second color, and the third color may be different colors from one another. In an embodiment, the first color may be one of red, green, and blue, the second color may be a color other than the first color, among red, green and blue, and the third color may be a color other than the first and second colors, among red, green and blue, for example. Also, magenta, cyan, and yellow may be alternatively used as the first to third colors, instead of red, green and blue. However, in the illustrated embodiment, the first color, the second color, and the third color are described as red, green and blue for the convenience of description.

Figure 3:
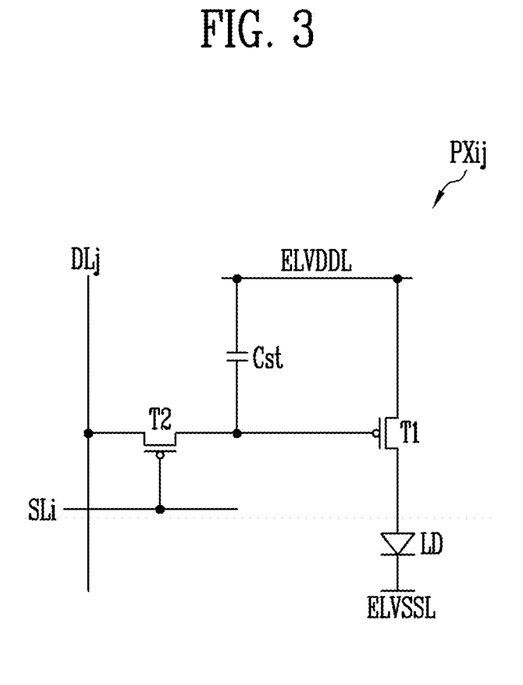
FIG. 3 is a diagram illustrating an embodiment of a pixel according to the invention.

FIG. 3 is a diagram illustrating an embodiment of a pixel according to the invention.

Referring to FIG. 3, an embodiment of a pixel PXij is illustrated. The other pixels may have substantially the same configuration, and thus a repeated description will be omitted.

The gate electrode of a transistor T1 may be coupled to the second electrode of a storage capacitor Cst, the first electrode thereof may be coupled to a first power line ELVDDL, and the second electrode thereof may be coupled to the anode of a light emitting diode LD. The transistor T1 may be also referred to as a driving transistor.

The gate electrode of a transistor T2 may be coupled to the i-th scan line SLi, the first electrode thereof may be coupled to the j-th data line DLj, and the second electrode thereof may be coupled to the second electrode of the storage capacitor Cst. The transistor T2 may be also referred to as a scan transistor.

The first electrode of the storage capacitor Cst may be coupled to the first power line ELVDDL, and the second electrode thereof may be coupled to the gate electrode of the transistor T1.

The anode of the light emitting diode LD may be coupled to the second electrode of the transistor T1, and the cathode thereof may be coupled to a second power line ELVSSL. During the emission period of the light emitting diode LD, the first power voltage applied to the first power line ELVDDL may be greater than the second power voltage applied to the second power line ELVSSL. In an embodiment, the light emitting diodes of pixels may have a common cathode. Here, the cathode may be provided in a wide plate shape so as to cover the display area DA.

The light emitting diode LD may include an organic light emitting diode, an inorganic light emitting diode, a quantum dot/well light emitting diode, or the like. Also, the light emitting diode LD may include a plurality of light emitting diodes coupled in series, parallel, or series/parallel to each other.

In the illustrated embodiment, the transistors T1 and T2 are illustrated as P-type transistors, but those skilled in the art may use an N-type transistor as a substitute for at least one of the transistors by reversing the polarity of a signal.

When a scan signal of a turn-on level is applied to the i-th scan line SLi, the transistor T2 may be turned on. Here, a data voltage, with which the j-th data line DLj is charged, may be stored in the storage capacitor Cst. The transistor T1 may enable a driving current to flow in response to the difference between gate-source voltages maintained by the storage capacitor Cst. The driving current may flow along a path passing through the first power line ELVDDL, the transistor T1, the light emitting diode LD, and the second power line ELVSSL. The light emitting diode LD may emit light with luminance corresponding to the amount of driving current.

Figure 4:
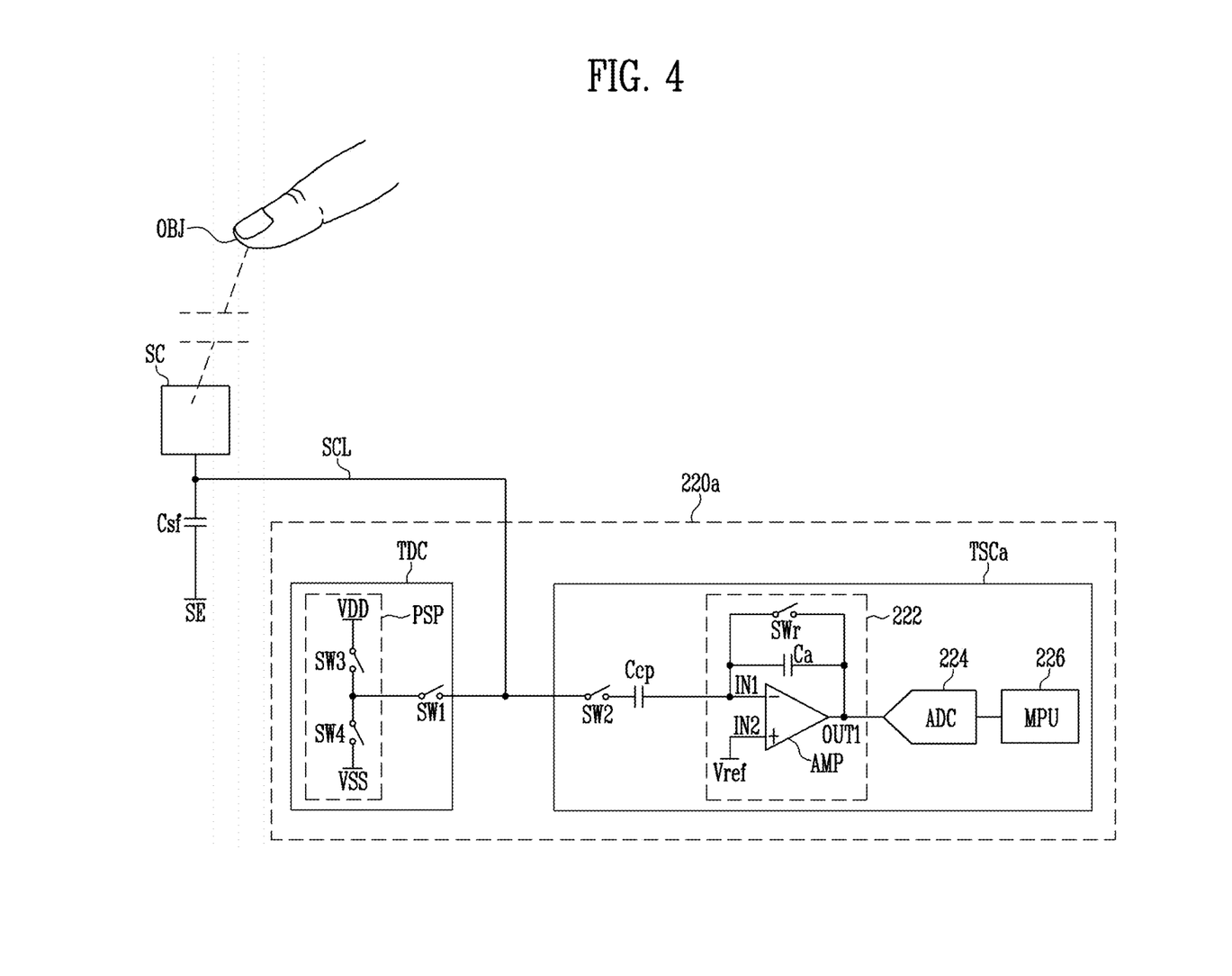
FIG. 4 is a diagram illustrating an embodiment of a sensor driver according to the invention.
Figure 5:
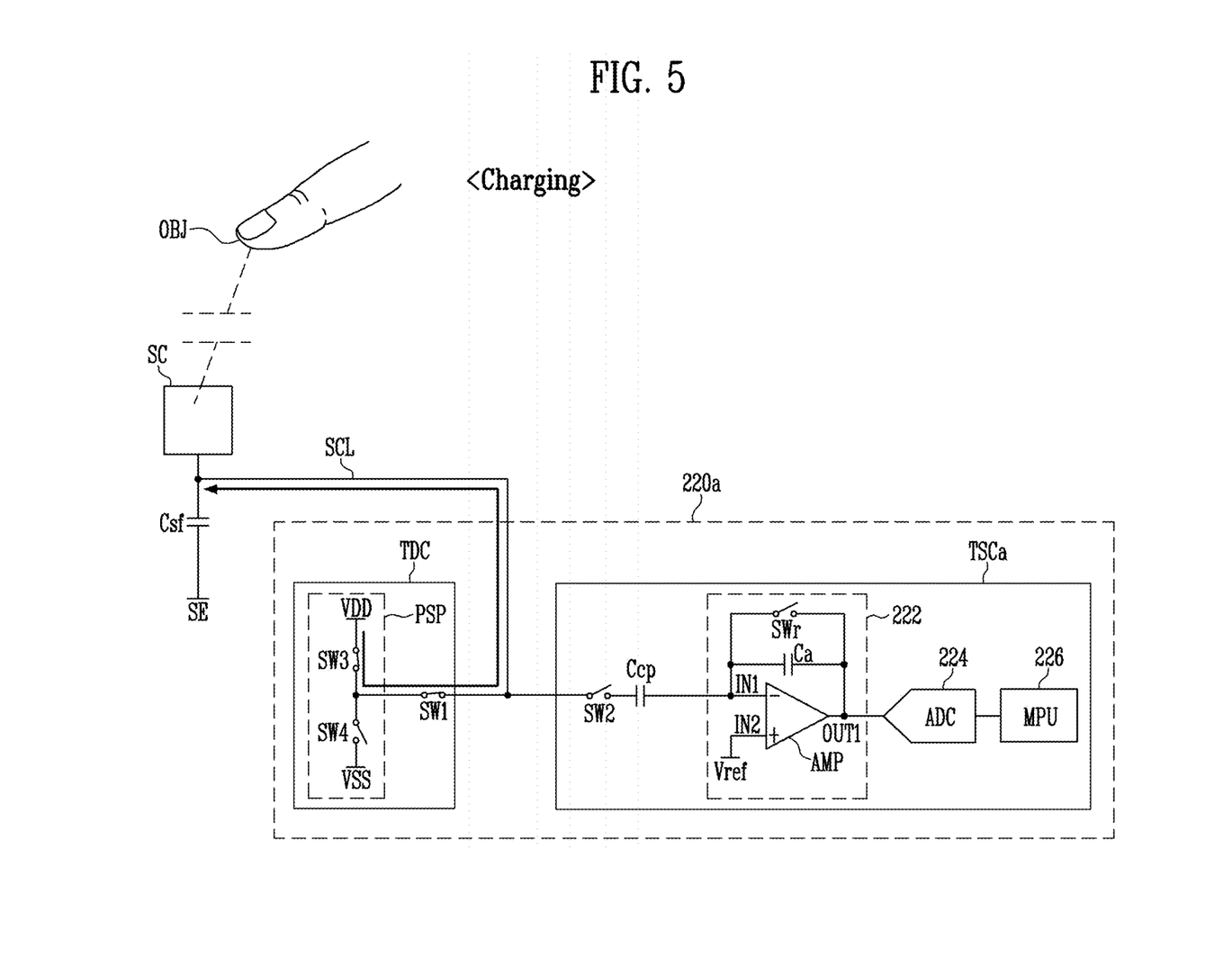
FIGS. 5 to 7 are diagrams illustrating the operation of the sensor driver of FIG. 4.
Figure 6:
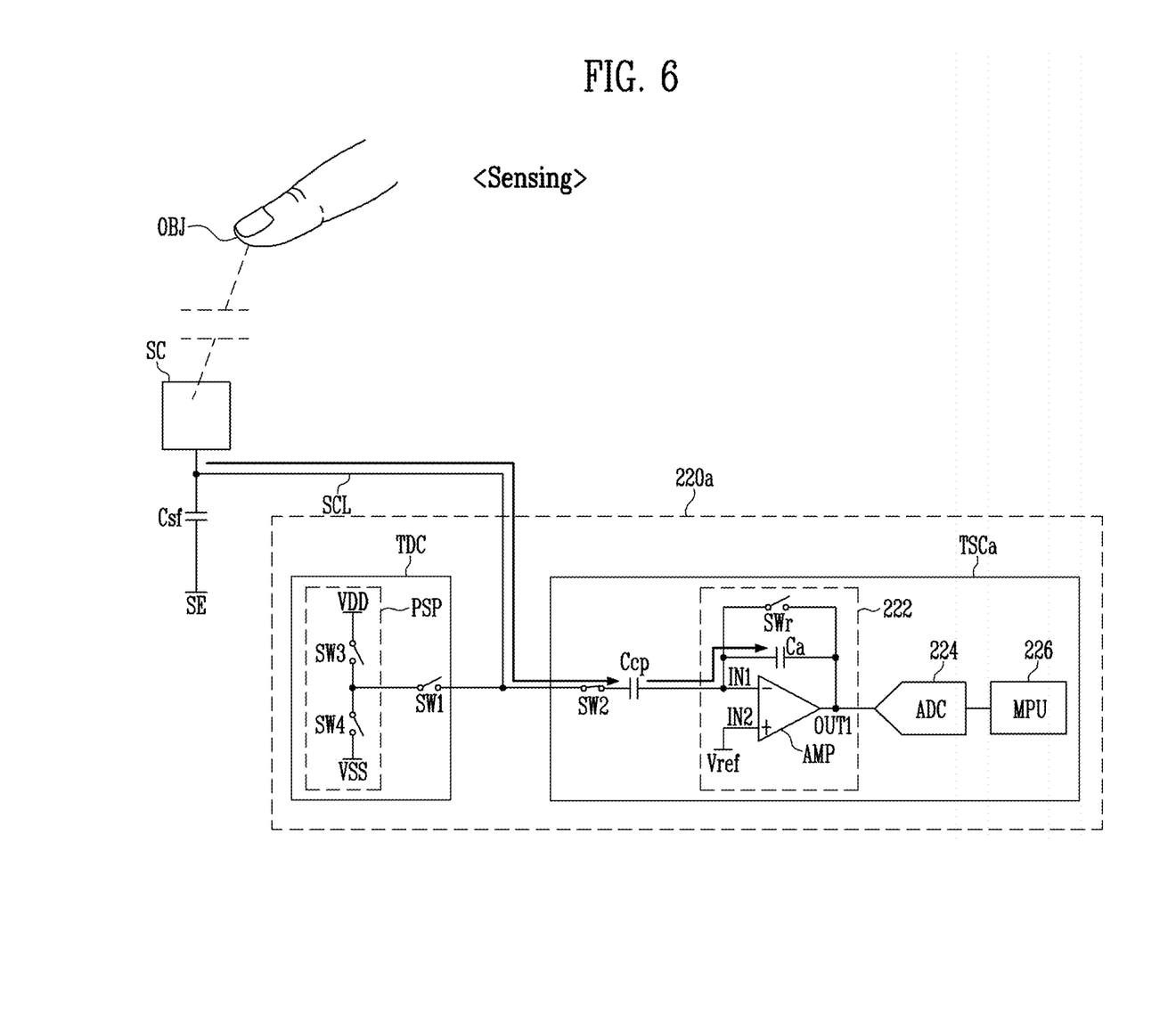
Figure 7:
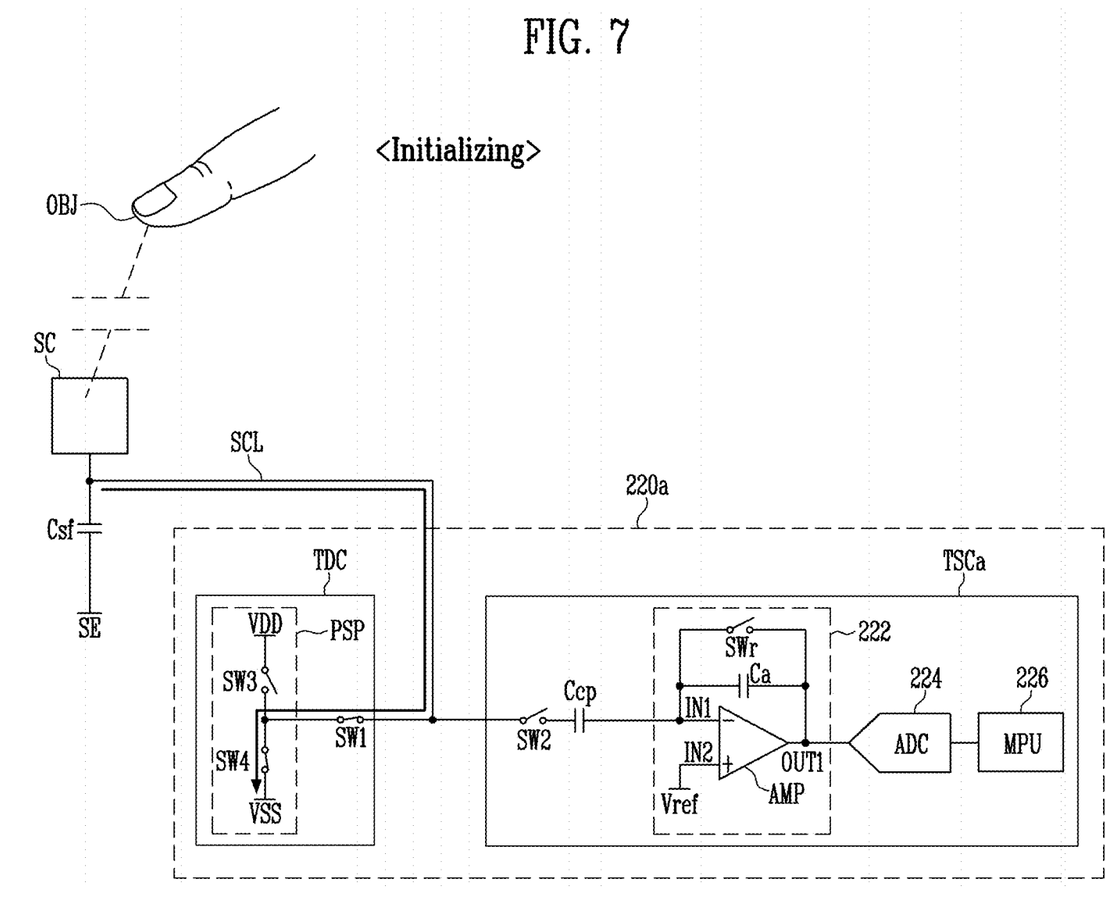

FIG. 4 is a diagram illustrating an embodiment of a sensor driver according to the invention. FIGS. 5 to 7 are diagrams illustrating the operation of the sensor driver of FIG. 4.

Referring to FIG. 4, the sensor driver 220a in an embodiment of the invention may include a sensor transmitter TDC and a sensor receiver TSCa. Hereinbelow, a description will be made based on a single sensor cell SC and a single sensor line SCL. However, the same description may also be applied to the other sensor cells and sensor lines of the sensor 120.

The sensor cell SC and a support electrode SE may form a self-capacitance Csf. The support electrode SE may be an electrode of the display 110. In an embodiment, when the display 110 is a self-emissive display panel, the cathode of the light emitting diodes of pixels may correspond to the support electrode SE, for example. When the display 110 is a non-emissive display panel, the common electrode of the pixels may correspond to the support electrode SE. However, the self-capacitance Csf may include other electrodes adjacent to the sensor cell SC so as to form a meaningful capacitance in a sensing process, rather than including only a single electrode.

The sensor transmitter TDC may include a first switch SW1 and a power supply PSP. The first switch SW1 may be coupled to the sensor line SCL. The power supply PSP may supply a charging signal to the sensor line SCL during a first period during which the first switch SW1 is turned on.

The first switch SW1 may selectively couple the power supply PSP to the sensor line SCL. The power supply PSP may supply a charging signal VDD or an initialization signal VSS. The voltage level of the charging signal VDD may be different from the voltage level of the initialization signal VSS. In an embodiment, the voltage level of the charging signal VDD may be greater than the voltage level of the initialization signal VSS, for example. The power supply PSP may include a third switch SW3 and a fourth switch SW4, each of which is coupled to the first switch SW1. In an embodiment, the power supply PSP may supply the charging signal VDD to an output terminal when the third switch SW3 is turned on, and may supply the initialization signal VSS to the output terminal when the fourth switch SW4 is turned on, for example.

The sensor receiver TSCa may include a second switch SW2 and a sensor channel 222. The second switch SW2 may be coupled to the sensor line SCL. That is, the first switch SW1 and the second switch SW2 may be coupled to the same sensor line SCL. The sensor channel 222 may receive a sensing signal from the sensor line SCL during a second period during which the second switch SW2 is turned on. The second period may be a period after the first period. The first period and the second period may not overlap each other.

In the illustrated embodiment, the sensor receiver TSCa may further include a coupling capacitor Ccp having a first electrode and a second electrode, which are coupled to the second switch SW2 and the sensor channel 222, respectively. The coupling capacitor Ccp may be in a floating state while the second switch SW2 is turned off.

The sensor channel 222 may output a voltage signal having a voltage level corresponding to the amount of charge with which the sensor cell SC is charged to an output terminal OUT1. In an embodiment, the sensor channel 222 may be an integrator, for example.

In an embodiment, the sensor channel 222 may include an amplifier AMP, a sensing capacitor Ca, and a reset switch SWr, for example. The amplifier AMP may include a first input terminal IN1 coupled to the second electrode of the coupling capacitor Ccp, a second input terminal IN2 which receives a reference voltage Vref, and the output terminal OUT1. In an embodiment, the amplifier AMP may be an operational amplifier, for example. In an embodiment, the first input terminal IN1 may be an inversion terminal, and the second input terminal IN2 may be a non-inversion terminal, for example. The voltage level of the reference voltage Vref may be greater than the voltage level of the initialization signal VSS and may be less than the voltage level of the charging signal VDD. The sensing capacitor Ca may couple the first input terminal IN1 to the output terminal OUT1. The reset switch SWr may selectively couple the first input terminal IN1 to the output terminal OUT1.

Also, the sensor receiver TSCa may further include an analog-to-digital converter ("ADC") 224 and a processor 226. The ADC 224 may receive the signal output from the sensor channel 222. The ADC 224 may convert the analog voltage level, output by the sensor channel 222, into a digital value and output the digital value. The processor 226 may receive the signal output from the ADC 224. The processor 226 may determine a touch input by a user using the received digital value.

The first period during which the sensor cell SC is charged will be described with reference to FIG. 5.

The power supply PSP may supply a charging signal VDD to the sensor cell SC during the first period. In an embodiment, the first switch SW1 and the third switch SW3 are turned on during the first period, whereby the power supply PSP may supply the charging signal VDD to the sensor cell SC, for example. During the first period, the second switch SW2 may be in a turn-off state.

Here, the self-capacitance Csf of the sensor cell SC may vary depending on whether an object OBJ is adjacent to the sensor cell SC, whereby the amount of charge with which the sensor cell SC is charged may change. In an embodiment, the object OBJ may be a finger of a user, or the like, for example.

In the illustrated embodiment, the power supply PSP may supply a voltage higher than the withstanding voltage of the amplifier AMP as the charging signal VDD. In an embodiment, the voltage level of the charging signal VDD may be set to about 13 volts (V) even when the amplifier AMP is capable of being driven with a withstanding voltage ranging from about 0 V to about 3 V, for example.

The second period during which the sensor cell SC is sensed will be described with reference to FIG. 6.

The second switch SW2 may electrically couple the sensor channel 222 to the sensor cell SC during the second period after the first period. That is, the second switch SW2 may be in a turn-on state during the second period. During the second period, the first switch SW1 may be in a turn-off state.

As described above, even though the magnitude of the charging signal VDD exceeds the withstanding voltage of the amplifier AMP, the coupling capacitor Ccp may decrease the magnitude of the sensing signal to be applied to the first input terminal IN1 in the illustrated embodiment. That is, the sensing signal applied to the first input terminal IN1 may satisfy the withstanding voltage range of the amplifier AMP.

In the illustrated embodiment, there is an advantage in that the signal-to-noise ratio ("SNR") of the sensing signal may increase because it is possible to increase the voltage level of the charging signal VDD. Because the signal reduction ratio using the coupling capacitor Ccp is identically applied to the sensing signal and a noise signal, a high SNR is also maintained at the first input terminal IN1.

The sensor channel 222 may receive the sensing signal from the sensor cell SC during the second period. In an embodiment, the sensor channel 222 may output a voltage signal corresponding to the amount of charge with which the sensor cell SC is charged to the output terminal OUT1, for example.

The ADC 224 converts the voltage signal received from the sensor channel 222 into a digital value, and the processor 226 may determine a touch input by a user, or the like using the received digital value.

A third period during which the sensor cell SC is initialized will be described with reference to FIG. 7.

The first switch SW1 may electrically couple the power supply PSP to the sensor cell SC during the third period after the second period. That is, the first switch SW1 may be in a turn-on state during the third period.

The power supply PSP may supply an initialization signal VSS to the sensor cell SC through the sensor line SCL during the third period. In an embodiment, the fourth switch SW4 is turned on during the third period, whereby the power supply PSP may supply the initialization signal VSS to the sensor cell SC, for example. Accordingly, the voltage level of the sensor cell SC may be the same as the voltage level of the initialization signal VSS when the third period ends. In an embodiment, the voltage level of the initialization signal VSS may be lower than the voltage level of the reference voltage Vref, for example. In an embodiment, the voltage level of the reference voltage Vref may be a value between the voltage level of the charging signal VDD and the voltage level of the initialization signal VSS, for example.

In an embodiment, the reset switch SWr is turned on during the third period or another period, whereby the amount of charge in the sensing capacitor Ca may be initialized.

Figure 8:
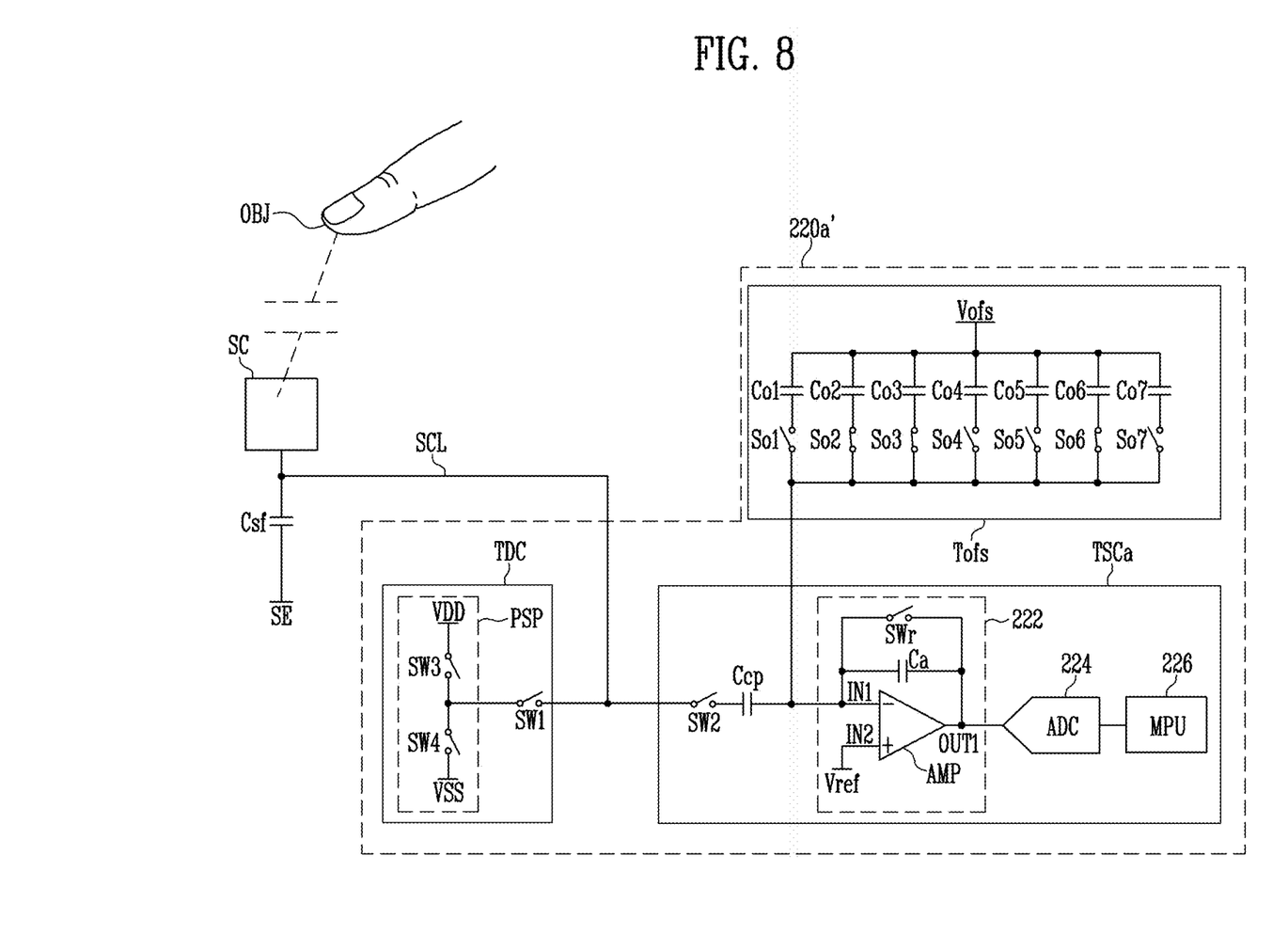
FIGS. 8 and 9 are diagrams illustrating an embodiment of a sensor driver according to the invention.
Figure 9:
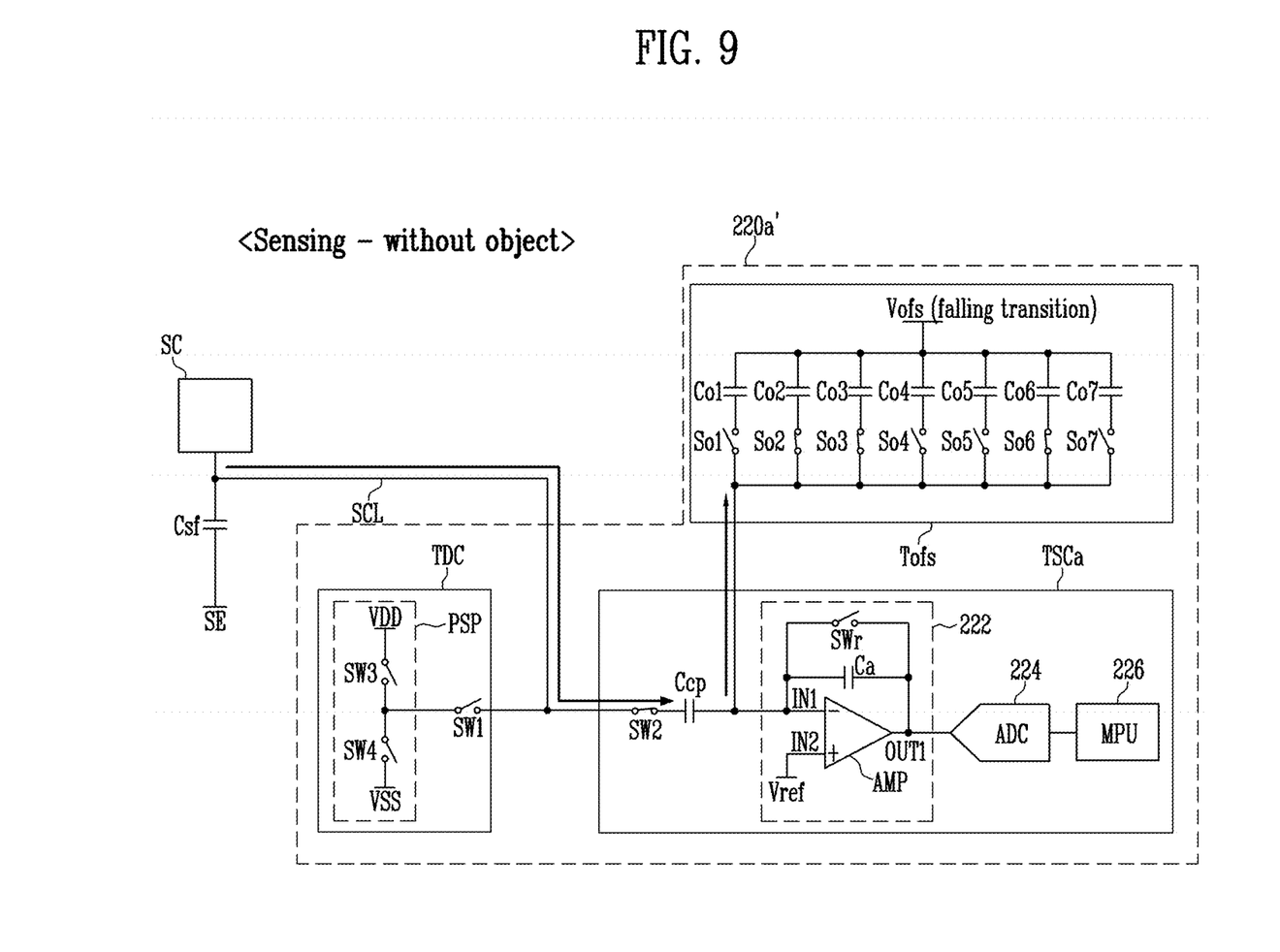

FIG. 8 and FIG. 9 are diagrams illustrating an embodiment of a sensor driver according to the invention.

Referring to FIG. 8, the sensor driver 220a' further includes a sensor offset component Tofs, compared to the sensor driver 220a of FIG. 4.

The sensor offset component Tofs may be coupled to the sensor receiver TSCa, and may include offset capacitors Co1, Co2, Co3, Co4, Co5, Co6 and Co7 and offset switches So1, So2, So3, So4, So5, So6 and So7 coupled to the respective offset capacitors Co1 to Co7. In an embodiment, the offset switches So1 to So7 may be coupled in series to the respective offset capacitors Co1 to Co7 corresponding thereto, and the series-coupled units are coupled in parallel to each other, thereby forming the sensor offset component Tofs. One end of the sensor offset component Tofs (e.g., the first electrodes of the offset capacitors Co1 to Co7) may receive an offset voltage Vofs in common, for example. Also, the other end of the sensor offset component Tofs (e.g., one ends of the offset switches So1 to So7) may be coupled to the sensor receiver TSCa. In the illustrated embodiment, seven offset capacitors and seven offset switches are illustrated, but the invention is not limited thereto, a number of the offset capacitors and a number of the offset switches may be different in other embodiments.

At least two of the offset capacitors Co1 to Co7 may have different capacitances. In an embodiment, all of the offset capacitors Co1 to Co7 may have different capacitances.

In display devices (or touch sensors), the self-capacitances Csf of sensor cells SC thereof may be different from each other due to process variation. Whether to turn on or off the offset switches So1 to So7 may be calibrated before the display device 1 (or the touch sensor) is released as a product. Depending on whether the offset switches So1 to So7 are turned on or off, the offset capacitance provided by the sensor offset component Tofs may be set. In an embodiment, in the case of FIG. 8, because only the second, third and sixth offset switches So2, So3 and So6 are in a turn-on state, the parallel sum of the capacitances of the second, third and sixth offset capacitors Co2, Co3 and Co6 is the offset capacitance provided by the sensor offset component Tofs, for example. The offset capacitance may be set such that the self-capacitance Csf may be offset when an object OBJ is not present.

Whether the offset switches So1 to So7 are turned on or off may be constantly maintained after the display device 1 is released as a product. That is, during the first and second periods, some (So2, So3 and So6) of the offset switches So1 to So7 may remain turned on, and the remaining ones (So1, So4, So5 and So7) of the offset switches So1 to So7 may remain turned off. Similarly, during the third period, some (So2, So3 and So6) of the offset switches So1 to So7 may remain turned on, and the remaining ones (So1, So4, So5 and So7) of the offset switches So1 to So7 may remain turned off.

In an embodiment, the sensor offset component Tofs may be coupled to a node between the second electrode of the coupling capacitor Ccp and the first input terminal IN1. Accordingly, the offset capacitance that has to be provided by the sensor offset component Tofs (or the desired area of the offset capacitors Co1 to Co7) may decrease.

The process in which the sensor offset component Tofs operates during the second period will be described with reference to FIG. 9.

During the second period, the offset voltage Vofs applied in common to the first electrodes of the offset capacitors Co1 to Co7 may fall. When no object OBJ is present, all or most of the charges of a sensing signal may move to the sensor offset component Tofs, as calibrated in advance. Here, no charges are received by the sensor channel 222, or charges received thereby are negligible.

Conversely, when an object OBJ is present, some of the charges of the sensing signal, corresponding to a change in the self-capacitance Csf, move to/from the sensor channel 222. Accordingly, without saturation of the sensing capacitor Ca, the sensor channel 222 may sense whether the self-capacitance Csf is changed.

In an embodiment, the offset voltage Vofs may rise after the second period. Accordingly, the offset voltage Vofs may fall again in the sensing period (second period) of the next sequence (the next sensing frame).

Figure 10:
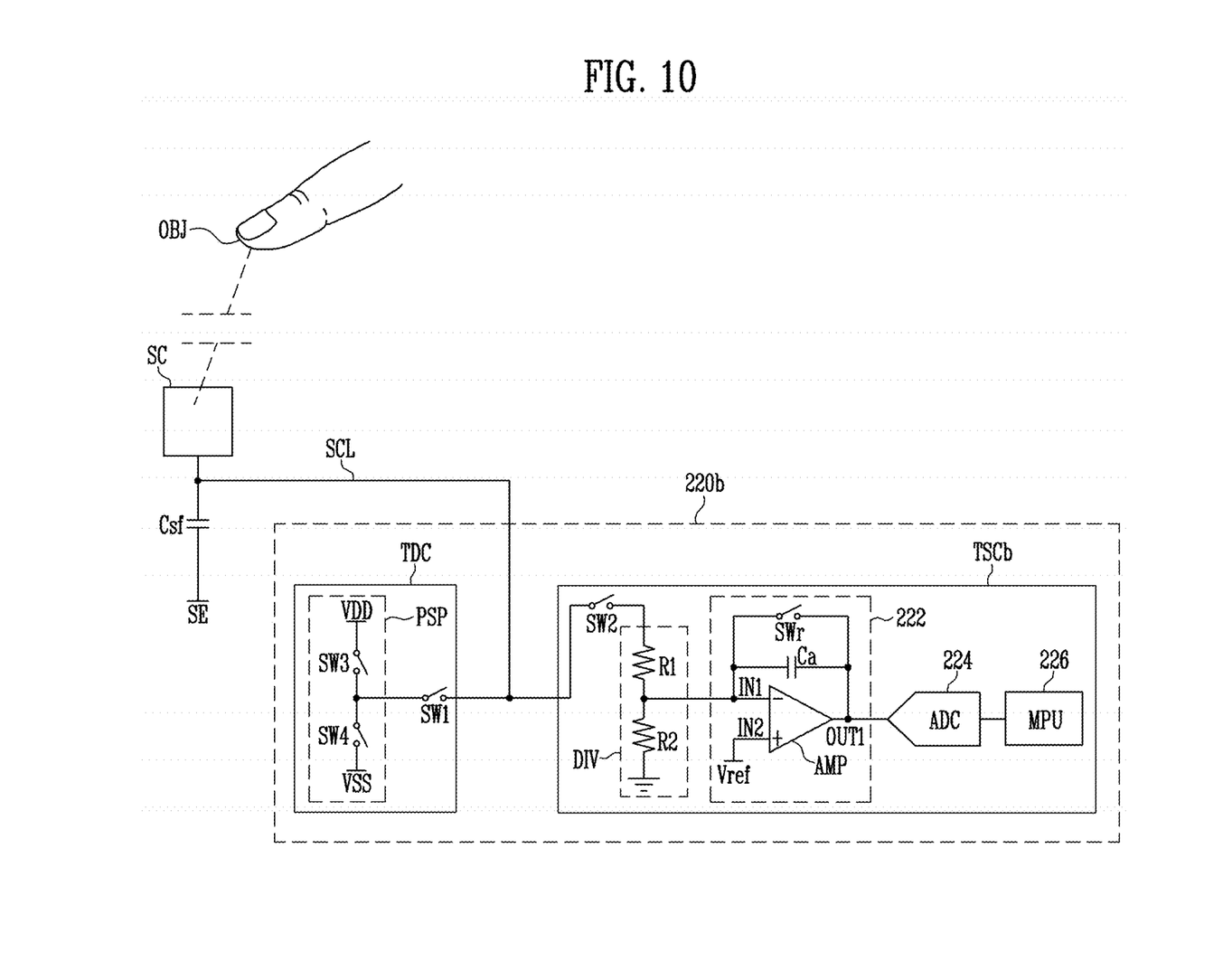
FIGS. 10 and 11 are diagrams illustrating embodiments of sensor drivers according to the invention.
Figure 11:
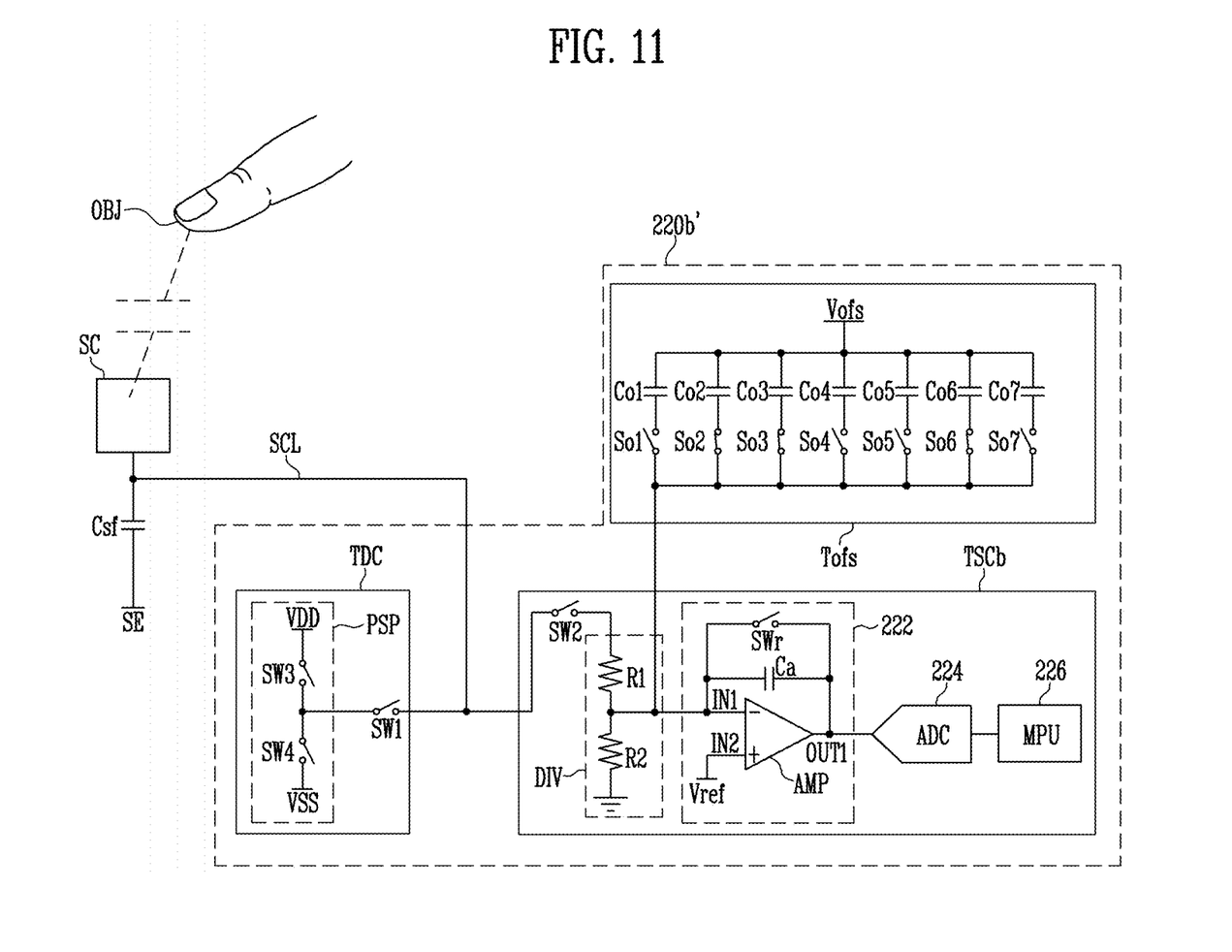

FIG. 10 and FIG. 11 are diagrams illustrating embodiments of sensor drivers according to the invention.

Referring to FIG. 10, the sensor receiver TSCb of the sensor driver 220b may include a voltage divider DIV.

The voltage divider DIV may be coupled between the second switch SW2 and the sensor channel 222. In an embodiment, the voltage divider DIV may include resistors R1 and R2 coupled in series to each other, for example. The first input terminal IN1 of the amplifier AMP may be coupled to a point between the resistors R1 and R2. In an embodiment, the first electrode of the first resistor R1 may be coupled to the second switch SW2, and the second electrode thereof may be coupled to the first input terminal IN1, for example. In an embodiment, the first electrode of the second resistor R2 may be coupled to the second electrode of the first resistor R1, and the second electrode thereof may be coupled to the ground (or another reference voltage), for example. In an embodiment, the first input terminal IN1 may be coupled to the second electrode of the first resistor R1 or the first electrode of the second resistor R2, for example.

Similar to the embodiment of FIG. 4, even though the voltage level of the charging signal VDD is raised, the magnitude of the sensing signal to be applied to the first input terminal IN1 may also be decreased in the case in the illustrated embodiment. Accordingly, the SNR of the sensing signal may be increased.

Because the driving method of FIGS. 5 to 7 may be identically applied to the sensor driver 220b, a repeated description of the driving method will be omitted.

Referring to FIG. 11, the sensor driver 220b' may further include a sensor offset component Tofs.

In an embodiment, the sensor offset component Tofs may be coupled to a node between the voltage divider DIV and the first input terminal IN1. Accordingly, the offset capacitance that has to be provided by the sensor offset component Tofs may be reduced.

Because the configuration and the driving method of the sensor offset component Tofs are the same as being described with reference to FIG. 8 and FIG. 9, a repeated description will be omitted.

A touch sensor and a display device including the same according to the invention enable a high-voltage charging signal to be used in a sensing method using a self-capacitance, whereby a sensing signal having a high SNR may be generated.

The drawings and the detailed description of the invention are examples for the invention and are provided for illustrative purpose, rather than limiting meanings or restricting the scope of the invention. Therefore, it will be appreciated to those skilled in the art that various modifications and other embodiments may be implemented from those embodiments.

What is claimed is:

1. A touch sensor, comprising:
   a sensor cell coupled to a sensor line;
   a sensor transmitter including a first switch coupled to the sensor line and a power supply which supplies a charging signal to the sensor line during a first period during which the first switch is turned on; and
   a sensor receiver including a second switch coupled to the sensor line and a sensor channel which receives a sensing signal from the sensor line during a second period during which the second switch is turned on,
   wherein the sensor receiver further includes a coupling capacitor including a first electrode coupled to the second switch and a second electrode coupled to the sensor channel,
   wherein the first switch is in a turn-on state during a third period after the second period, and
   wherein the power supply supplies an initialization signal to the sensor line during the third period.

2. The touch sensor according to claim 1, wherein the sensor channel is an integrator.

3. The touch sensor according to claim 1, wherein the sensor channel includes
   an amplifier including a first input terminal coupled to the second electrode of the coupling capacitor, a second input terminal which receives a reference voltage, and an output terminal;
   a sensing capacitor which couples the first input terminal to the output terminal; and
   a reset switch which selectively couples the first input terminal to the output terminal.

4. The touch sensor according to claim 3, wherein the sensor receiver further includes
   an analog-to-digital converter which receives a signal output from the sensor channel; and
   a processor which receives a signal output from the analog-to-digital converter.

5. The touch sensor according to claim 3, wherein:
   the second switch is in a turn-off state during the first period, and
   the first switch is in the turn-off state during the second period.

6. The touch sensor according to claim 5, wherein a voltage level of the reference voltage is a value between a voltage level of the charging signal and a voltage level of the initialization signal.

7. The touch sensor according to claim 1, further comprising:
   a sensor offset component coupled to the sensor receiver and including offset capacitors and offset switches respectively coupled to the offset capacitors.

8. The touch sensor according to claim 7, wherein, during the first period and the second period, a part of the offset switches remains turned on and remaining ones of the offset switches remain turned off.

9. The touch sensor according to claim 8, wherein an offset voltage applied in common to first electrodes of the offset capacitors decreases during the second period.

10. A display device, comprising:
    pixels respectively including light emitting diodes;
    a sensor cell which is coupled to a sensor line and forms a self-capacitance with a cathode of the light emitting diodes;
    a sensor transmitter including a first switch coupled to the sensor line and a power supply which supplies a charging signal to the sensor line during a first period during which the first switch is turned on; and
    a sensor receiver including a second switch coupled to the sensor line and a sensor channel which receives a sensing signal from the sensor line during a second period during which the second switch is turned on,
    wherein the sensor receiver further includes a coupling capacitor including a first electrode coupled to the second switch and a second electrode coupled to the sensor channel,
    wherein the first switch is in a turn-on state during a third period after the second period, and
    wherein the power supply supplies an initialization signal to the sensor line during the third period.

11. A touch sensor, comprising:
    a sensor cell coupled to a sensor line;
    a sensor transmitter including a first switch coupled to the sensor line and a power supply which supplies a charging signal to the sensor line during a first period during which the first switch is turned on; and
    a sensor receiver including a second switch coupled to the sensor line and a sensor channel which receives a sensing signal from the sensor line during a second period during which the second switch is turned on, wherein the sensor receiver further includes a voltage divider coupled between the second switch and the sensor channel, and the voltage divider includes a first resistor and a second resistor, and wherein the first resistor and the second resistor are connected in series between the second switch and the ground, and a point between the first resistor and the second resistor is directly connected to a first input terminal of an amplifier included in the sensor channel.

12. The touch sensor according to claim 11, wherein the amplifier further includes a second input terminal which receives a reference voltage, and an output terminal;

wherein the sensor channel further includes a sensing capacitor which couples the first input terminal to the output terminal; and a reset switch which selectively couples the first input terminal to the output terminal.

13. The touch sensor according to claim 12, wherein:

the second switch is in a turn-off state during the first period, and the first switch is in the turn-off state during the second period.

14. The touch sensor according to claim 13, wherein:

the first switch is in a turn-on state during a third period after the second period, and the power supply supplies an initialization signal to the sensor line during the third period.

15. The touch sensor according to claim 14, wherein a voltage level of the reference voltage is a value between a voltage level of the charging signal and a voltage level of the initialization signal.

16. The touch sensor according to claim 11, further comprising:

a sensor offset component coupled to the sensor receiver and including offset capacitors and offset switches respectively coupled to the offset capacitors.

17. The touch sensor according to claim 16, wherein, during the first period and the second period, a part of the offset switches remains turned on and remaining ones of the offset switches remain turned off.

18. The touch sensor according to claim 17, wherein an offset voltage applied in common to first electrodes of the offset capacitors decreases during the second period.

* * * * *